(12) United States Patent
Kato

(10) Patent No.: US 8,811,027 B2
(45) Date of Patent: Aug. 19, 2014

(54) DC-DC CONVERTER

(75) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 238 days.

(21) Appl. No.: 13/584,955

(22) Filed: Aug. 14, 2012

(65) Prior Publication Data

US 2013/0049730 A1 Feb. 28, 2013

(30) Foreign Application Priority Data

Aug. 25, 2011 (JP) ................. 2011-183464

(51) Int. Cl.
*H05K 7/00* (2006.01)

(52) U.S. Cl.
USPC ........... 361/760; 361/271; 361/748; 361/794; 257/728; 257/737; 257/773; 257/528; 323/224; 333/204; 333/247

(58) Field of Classification Search
CPC ........... H05K 1/14; H05K 1/16; H05K 1/141; H05K 1/165; H05K 1/186; H05K 1/0237; H05K 7/00; H05K 2201/10045; H01L 23/48; H01L 23/50; H01L 23/52; H01L 23/66; H01L 23/5389; H01G 4/232; H02H 7/10; H02M 1/00; H02M 3/00; H05F 3/02

USPC .......... 361/760, 271, 748, 794; 257/728, 737, 257/773, 528; 323/224; 333/204, 247
See application file for complete search history.

(56) References Cited

U.S. PATENT DOCUMENTS

| | | | |
|---|---|---|---|
| 6,833,285 B1 * | 12/2004 | Ahn et al. | 438/107 |
| 2001/0004204 A1 * | 6/2001 | Mitsuaki | 323/224 |
| 2007/0188267 A1 * | 8/2007 | Togashi | 333/185 |
| 2010/0103058 A1 * | 4/2010 | Kato et al. | 343/702 |
| 2011/0182039 A1 * | 7/2011 | Kato et al. | 361/736 |
| 2011/0316612 A1 * | 12/2011 | de Rochemont | 327/524 |
| 2013/0334321 A1 * | 12/2013 | Kato et al. | 235/493 |

FOREIGN PATENT DOCUMENTS

JP 06-152079 A 5/1994

* cited by examiner

*Primary Examiner* — Xiaoliang Chen
(74) *Attorney, Agent, or Firm* — Keating & Bennett, LLP

(57) ABSTRACT

A DC-DC converter includes an insulating substrate with an inductor provided on the top surface thereof, a switching control IC provided therein, and a ground electrode pattern provided on the bottom surface thereof. The ground electrode pattern includes a first pattern and a second pattern separated from each other and a bridge pattern that connects the first and second patterns to each other. A capacitor and the switching control IC is connected to each of the first and second patterns. The bridge pattern faces the inductor and has a smaller width than that of the first and second patterns.

3 Claims, 7 Drawing Sheets

DC-DC CONVERTER

BACKGROUND OF THE INVENTION

1. Field of the Invention

The present invention relates to DC-DC converters in which an inductor and a switching control IC are provided on an insulator substrate.

2. Description of the Related Art

In cellular phones, multifunctional portable terminals, or the like, a plurality of voltages are required to support multiple frequency bands, and non-isolated DC-DC converters are used. A DC-DC converter includes a coil, capacitors, and a switching IC. An example of an existing DC-DC converter has a configuration in which a coil pattern is formed in an insulator substrate and capacitors and a switching IC are mounted on the surface of the insulator substrate.

In such a configuration, since a DC-DC converter includes a switching IC mounted on the surface of an insulator substrate, the dimension of the DC-DC converter in the thickness direction of the substrate is increased. Accordingly, a smaller (thinner) DC-DC converter is desired in cellular phones, which have become increasingly thinner. Hence, a DC-DC converter has been proposed which is made thinner by using a configuration in which a switching IC is formed in an insulator substrate and a coil and capacitors are formed on the surface of the substrate.

In addition, since high-frequency noise (switching noise) is generated during the switching operation performed by a switching IC in a DC-DC converter, it is necessary to take measures against such noise. In Japanese Unexamined Patent Application Publication No. 6-152079, a printed wire board is disclosed that is used for mounting electronic components and that can realize a stable operation even in an environment where electromagnetic noise is generated from the electronic components. Although most of the electromagnetic noise can be removed using a filter formed of, for example, a coil or a capacitor, there is a problem in that no mounting space is available. Hence, in Japanese Unexamined Patent Application Publication No. 6-152079, a magnetic material is pasted around holes that are used to attach the leads of electronic components. This realizes an effect similar to that realized when coils are inserted in series with the electronic components, whereby the electromagnetic noise is removed.

However, in a DC-DC converter, a ground electrode pattern is usually formed on the bottom surface of an insulator substrate as a common electrode for a coil, a switching IC and the like. Since components are connected to a common ground electrode pattern, switching noise generated by the coil and switching IC leaks from a ground line. This problem is not solved by the invention disclosed in Japanese Unexamined Patent Application Publication No. 6-152079.

SUMMARY OF THE INVENTION

Accordingly, preferred embodiments of the present invention provide a DC-DC converter that can significantly reduce and prevent leakage of switching noise, generated by the switching control operation performed by a switching IC, from a ground line via a common ground electrode pattern.

According to a preferred embodiment of the present invention, a DC-DC converter includes an insulating substrate including a plurality of insulator layers; an input terminal and an output terminal provided on the insulating substrate; a first inductor that includes a magnetic material and that is provided on a first layer of the insulating substrate and is connected between the input terminal and the output terminal; a switching control unit that is provided in the insulating substrate and connected between the input terminal and the output terminal and that performs on/off control of a switching device; and a ground electrode pattern provided on a second layer of the insulating substrate. The ground electrode pattern includes a first electrode pattern that is connected to the input terminal; a second electrode pattern that is connected to the output terminal and is separated from the first electrode pattern, and a connection electrode pattern that extends in a predetermined direction and connects the first and second electrode patterns to each other. The connection electrode pattern faces the first inductor and has a smaller width in a direction perpendicular or substantially perpendicular to the predetermined direction than the first and second electrode patterns.

With this configuration, since the connection electrode that connects the first and second electrode patterns has a small width, the inductance component of the connection pattern is larger than those of the first and second electrode patterns. Further, the first inductor that faces the connection electrode pattern functions as a bead (ferrite bead) and the connection pattern functions as a bead inductor. Hence, the magnetic material of the first inductor absorbs magnetic flux excited by a noise current, and loss is generated by the magnetic resistance of the magnetic material such that the noise current is significantly reduced and prevented. As a result, the noise current input to the ground electrode pattern from the first or second electrode pattern is prevented from leaking from the ground electrode pattern.

The DC-DC converter according to a preferred embodiment of the present invention may further include a capacitor that is provided on the first layer of the insulating substrate, where a first end of the capacitor is connected to the input terminal or the output terminal and the second end of the capacitor is connected to the first electrode pattern or the second electrode pattern.

With this configuration, a DC-DC converter module may be provided in which an inductor and a capacitor are mounted on a single insulating substrate.

The DC-DC converter according to a preferred embodiment of the present invention may be a multiple-output DC-DC converter, where the output terminal is provided in a plurality, the DC-DC converter further includes a second inductor that is provided on a third layer of the insulating substrate which is on the opposite side of the first layer with respect to the second layer and that is connected to the input terminal or an output terminal, and the second inductor includes a magnetic material and faces the first inductor with the connection electrode pattern therebetween.

With this configuration, since the connection electrode pattern is sandwiched between the first and second inductors, when a noise current flows through the connection electrode pattern, the two magnetic materials of the first and second inductors absorb the magnetic flux excited by the noise current. As a result, the noise current can be prevented more effectively.

According to various preferred embodiments of the present invention, a ground electrode pattern is arranged such that a connection electrode pattern facing an inductor has a small width and a first inductor faces the connection electrode pattern such that a noise current flowing through the connection electrode pattern is significantly reduced and prevented. As a result, leakage of the noise current from the ground electrode pattern is significantly reduced and prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
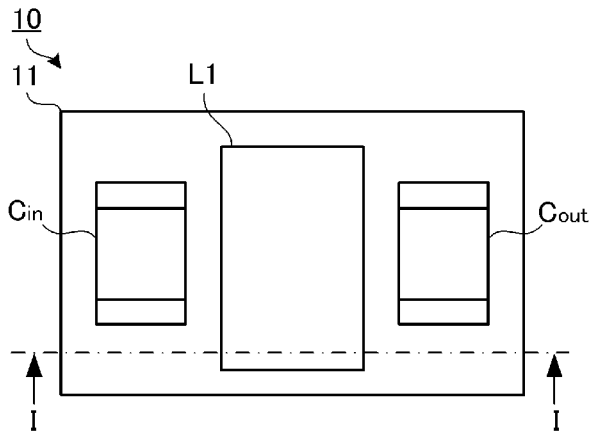
FIGS. 1A to 1C are schematic diagrams illustrating a configuration of a DC-DC converter according to a first preferred embodiment of the present invention.
Figure 1B:
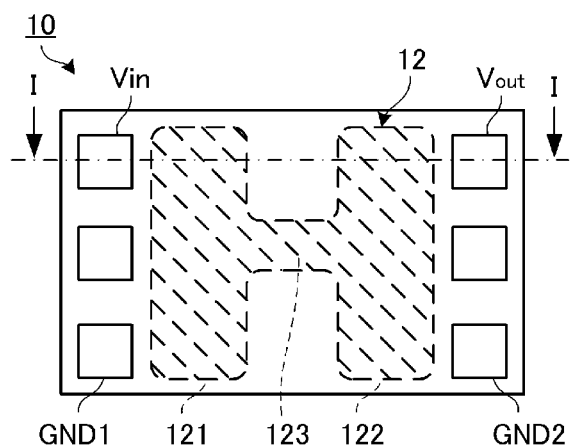
Figure 1C:
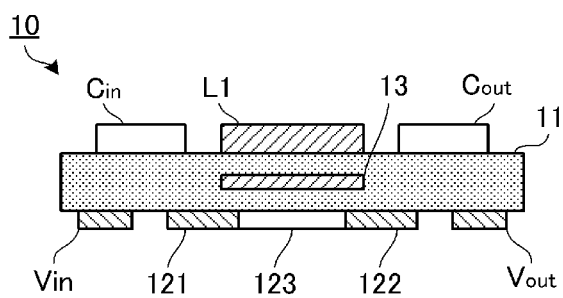

FIGS. 1A to 1C are schematic diagrams illustrating a configuration of a DC-DC converter 10 according to a first preferred embodiment of the present invention. FIG. 1A is a top view of the DC-DC converter 10. FIG. 1B is a bottom view of the DC-DC converter 10. FIG. 1C is a front cross-sectional view taken along line I-I in FIG. 1A and FIG. 1B.

The DC-DC converter 10 includes an insulating substrate including a plurality of insulator layers stacked on each other. The insulating substrate 11 has substantially rectangular top and bottom surfaces having long sides. The top surface (first layer) of the insulating substrate 11 is a surface on which a magnetic component and the like are mounted. The bottom surface of the insulating substrate 11 is a surface at which the DC-DC converter 10 is mounted on a circuit board, such as a main board.

The top surface of the insulating substrate 11 includes an inductor L1 and capacitors Cin and Cout mounted thereon. The inductor L1 is a chip inductor that is preferably formed by stacking and sintering magnetic green sheets (magnetic materials) including coil patterns printed thereon, and is arranged approximately in the center of the top surface. The capacitors Cin and Cout are arranged in the longitudinal direction so as to face each other with the inductor L1 therebetween. The wiring of the components will be described later in detail.

A switching control IC 13 is provided on an inner layer of the insulating substrate 11. The switching control IC 13 includes a MOS-FET (hereinafter simply called an FET) and switches a current flowing through the inductor L1 on and off.

An input terminal electrode Vin, an output terminal electrode Vout, and ground electrodes GND1 and GND2 are arranged near the four corners of the bottom surface (second layer) of the insulating substrate 11. The input terminal electrode Vin and the output terminal electrode Vout are arranged in the longitudinal direction of the insulating substrate 11. The ground electrodes GND1 and GND2 are arranged in the longitudinal direction so as to respectively face the input terminal electrode Vin and the output terminal electrode Vout in a direction (hereinafter called a lateral direction) perpendicular or substantially perpendicular to the longitudinal direction.

A ground electrode pattern 12 is arranged in the longitudinal direction between a group including the input terminal electrode Vin and the ground electrode GND1 and a group consisting of the output terminal electrode Vout and the ground electrode GND2. The ground electrodes GND1 and GND2 are electrically connected to the ground electrode pattern 12. The ground electrode pattern 12 may be provided on the bottom surface of the insulating substrate 11 and covered by a resist layer or may be provided on an inner layer of the insulating substrate 11.

The ground electrode pattern 12 preferably includes a first pattern 121, a second pattern 122, and a bridge pattern 123, and is substantially H-shaped. The first pattern 121 is provided in an area facing the capacitor Cin in the thickness direction of the insulating substrate 11. The second pattern 122 is provided in an area facing the capacitor Cout in the thickness direction of the insulating substrate 11. The first pattern 121 and the second pattern 122, which have similar shapes, are each longer in the lateral direction of the insulating substrate 11 than in the longitudinal direction of the insulating substrate 11 and are separated from each other. The bridge pattern 123 is provided in an area facing the inductor L1 in the thickness direction so as to be long in the longitudinal direction (predetermined direction) of the insulating substrate 11, and connects the first pattern 121 and the second pattern 122 to each other. The bridge pattern 123 is provided in such a manner as to have a shorter length (width) in the lateral direction than the first pattern 121 and the second pattern 122.

In this manner, the first pattern 121 and the second pattern 122 of the ground electrode pattern 12 are connected to each other through the bridge pattern 123, which has a smaller width (length in the lateral direction) than the first pattern 121 and the second pattern 122. Hence, the bridge pattern 123 has a larger inductance component than the first pattern 121 and the second pattern 122. The first pattern 121 is electrically connected to the ground electrode GND1, and the second pattern 122 is electrically connected to the ground electrode GND2. In other words, a ground line between the ground electrode GND1 and the ground electrode GND2 in the DC-DC converter 10 includes the bridge pattern 123. The bridge pattern 123 functions as a bead inductor as will be described later.

Figure 2A:
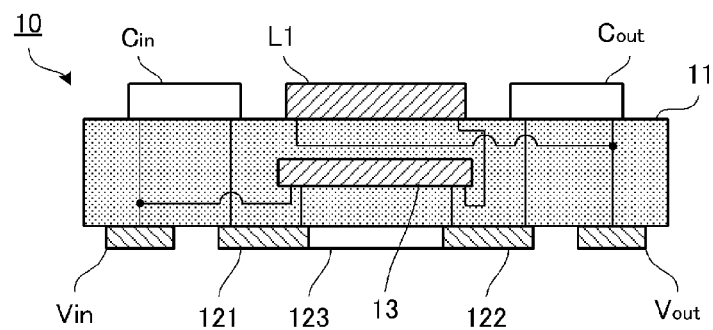
FIG. 2A is a schematic diagram illustrating how components are connected in a cross-section of a DC-DC converter and FIG. 2B is an equivalent circuit diagram of the DC-DC converter.
Figure 2B:
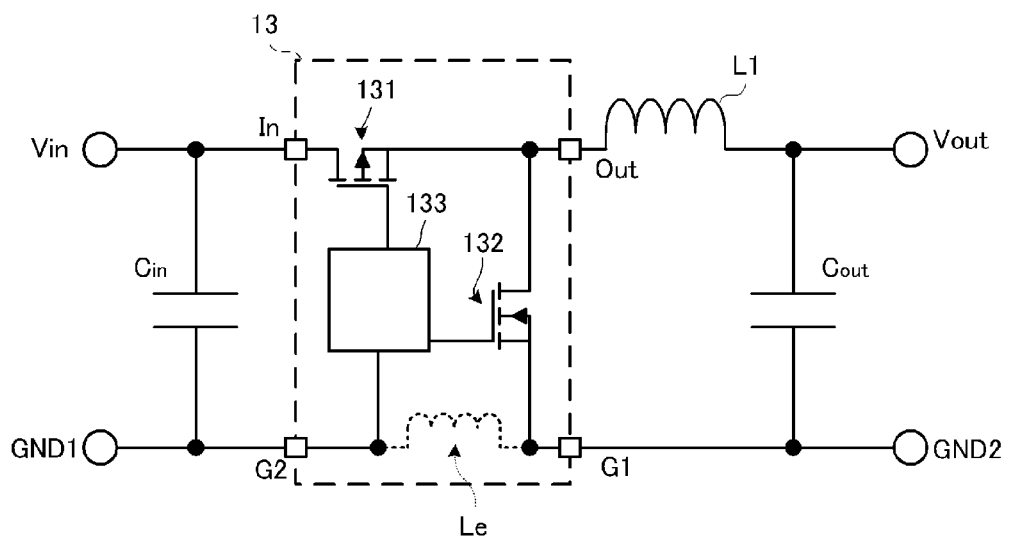

The wiring of the components of the DC-DC converter 10 will now be described. FIG. 2A is a schematic diagram illustrating how the components are connected in a cross-section of the DC-DC converter 10 and FIG. 2B is an equivalent circuit diagram of the DC-DC converter 10.

The switching control IC 13 includes an input terminal In, an output terminal Out, and ground terminals G1 and G2. An input line connected to the input terminal electrode Vin is connected to the input terminal In. One end (first end) of the capacitor Cin is connected to the input terminal electrode Vin and the other end (second end) of the capacitor Cin is connected to the first pattern 121. The capacitor Cin, for example, removes a noise component, thereby allowing a stable input voltage to be supplied to the switching control IC 13.

The output terminal Out of the switching control IC 13 is connected to the output terminal electrode Vout through the inductor L1. One end of the capacitor Cout is connected to a ground terminal electrode GND2 and the other end of the capacitor Cout is connected to the output terminal electrode Vout.

The ground terminal G1 of the switching control IC 13 is connected to the ground terminal electrode GND2. More specifically, the ground terminal G1 is connected to the ground terminal electrode GND2 through the second pattern 122. The ground terminal G2 is connected to the ground terminal electrode GND1. More specifically, the ground terminal G2 is connected to the ground terminal electrode GND1 through the first pattern 121.

The switching control IC 13 includes a p-type FET 131, an n-type FET 132, and a driver 133 that performs switching control of the FET 131 and the FET 132. The drain, source, and gate of the FET 131 are respectively connected to the input terminal In of the switching control IC 13, the output terminal Out, and the driver 133. The drain, source, and gate of the FET 132 are respectively connected to the output terminal Out, the ground terminal G1, and the driver 133. The ground side of the driver 133 is connected to the ground terminal G2. The driver 133 performs switching control of the FET 131 and the FET 132.

The ground terminal G1 is connected to the first pattern 121, and the ground terminal G2 is connected to the second pattern 122. In other words, the driver 133 is connected to the first pattern 121, and the source of the FET 132 is connected to the second pattern 122. Since the first pattern 121 and the second pattern 122 is connected to each other through the bridge pattern 123, an inductor Le which is the inductance component of the bridge pattern 123 is provided between the driver 133 and the source of the FET 132, as illustrated in FIG. 2B.

The DC-DC converter 10 configured in this manner passes a current through the inductor L1 by switching the FET 131 on and the FET 132 off to excite the inductor L1 and storing energy. Then, the DC-DC converter 10 commutates the stored energy by switching the FET 131 off and the FET 132 on. By repeating these operations, the DC-DC converter 10 outputs a voltage lower than an input voltage from the output terminal electrode Vout.

Hereinafter, the principle of how the DC-DC converter significantly reduces and prevents noise generated by the switching control IC 13 will be described.

In general, when a DC-DC converter is reduced in size, a ground wiring line cannot be made to be sufficiently long and, hence, a noise component generated in the circuit cannot be sufficiently reduced. For instance, when the ground electrode pattern is substantially shaped like a rectangle, noise generated in the switching control IC 13 is transmitted over an output line that is connected to the output terminal electrode Vout through the common ground electrode pattern. In the case of the present preferred embodiment, generated switching noise may be transmitted from the ground terminal G2 of the switching control IC 13 over an input line through the second pattern 122, the bridge pattern 123, and the first pattern 121.

Hence, referring to FIG. 1, in the ground electrode pattern 12 according to the present preferred embodiment, the width (length in the lateral direction of the insulating substrate 11) of the bridge pattern 123 located in an area facing the inductor L1, which is a magnetic component, is made to be small so as to form the equivalent inductor Le. When the DC-DC converter 10 is reduced in size, the thickness of the insulating substrate 11 is reduced such that the inductor L1 mounted on the top surface of the insulating substrate 11 comes close to the slim bridge pattern 123. At this time, the magnetic material of the inductor L1 functions as a bead (ferrite bead) of the equivalent inductor Le defined by the bridge pattern 123.

In other words, when a switching noise current flows through the bridge pattern 123, the magnetic material of the inductor L1 absorbs magnetic flux excited in the bridge pattern 123 by the switching noise current such that loss due to magnetic resistance in the magnetic material is generated and the switching noise is significantly reduced and prevented. As a result, in the DC-DC converter 10 according to the present preferred embodiment, leakage of switching noise through the ground electrode pattern 12 is significantly reduced and prevented only by changing the shape of the ground electrode pattern 12, without actually providing a bead inductor.

Second Preferred Embodiment

Hereinafter, a second preferred embodiment according to the present invention will be described. Whereas an example of a step-down DC-DC converter has been described in the first preferred embodiment, an example of a step-up DC-DC converter will be described in the second preferred embodiment, for example. Since the configuration (mounted magnetic components and the like) is preferably the same or substantially the same as that in the first preferred embodiment, the description thereof is omitted.

Figure 3A:
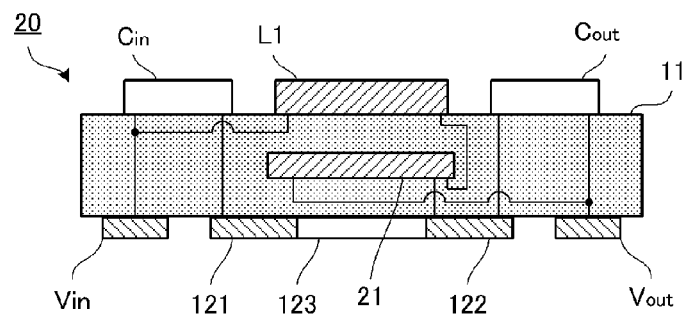
FIG. 3A is a schematic diagram illustrating how components are connected in a cross-section of a DC-DC converter according to a second preferred embodiment of the present invention and FIG. 3B is an equivalent circuit diagram of the DC-DC converter.
Figure 3B:
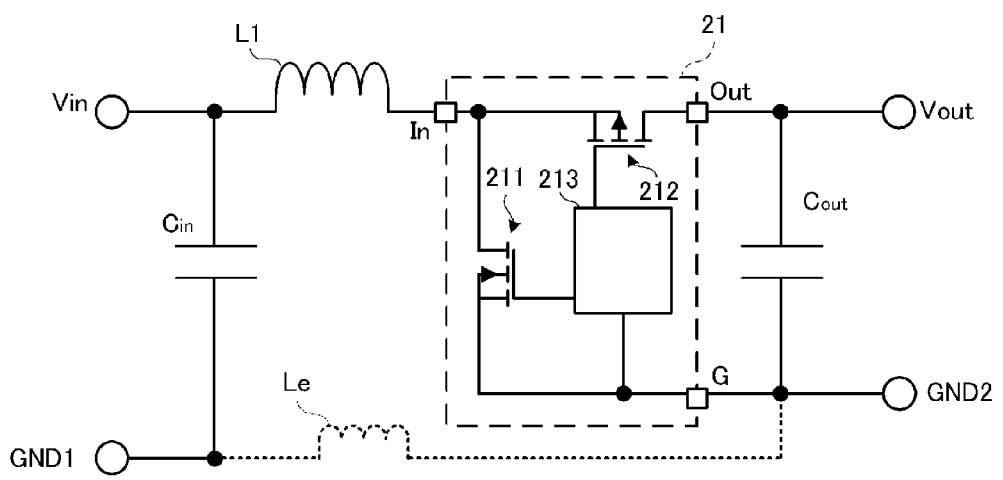

FIG. 3A is a schematic diagram illustrating how components are connected in a cross-section of a DC-DC converter 20 according to the second preferred embodiment, and FIG. 3B is an equivalent circuit diagram of the DC-DC converter 20.

A switching control IC 21 includes the input terminal In, the output terminal Out, and a ground terminal G. The input terminal In is connected to the input terminal electrode Vin through the inductor L1. One end of the capacitor Cin is connected to the first pattern 121 and the other end of the capacitor Cin is connected to the input terminal electrode Vin. The capacitor Cin, for example, removes the noise component of an input voltage.

The output terminal Out of the switching control IC 21 is connected to the output terminal electrode Vout. One end of the capacitor Cout is connected to the ground terminal electrode GND2 and the other end of the capacitor Cout is connected to the output terminal electrode Vout.

The ground terminal G of the switching control IC 21 is connected to the ground terminal electrode GND2. More specifically, the ground terminal G is connected to the ground terminal electrode GND2 through the second pattern 122.

The switching control IC 21 includes a p-type FET 211, an n-type FET 212, and a driver 213 that performs switching control of the FET 211 and the FET 212. The gates of the FET 211 and the FET 212 are connected to the driver 213. The driver 213 is connected to the ground terminal G of the switching control IC 21.

The drain and source of the FET 211 are respectively connected to the input terminal In of the switching control IC 13 and the ground terminal G of the switching control IC 21. The drain and source of the FET 212 are respectively connected to the input terminal In of the switching control IC 21 and the output terminal Out. The ground terminal G is connected to the second pattern 122 and the second pattern 122 is connected to the first pattern 121 through the bridge pattern 123. Hence, as illustrated in FIG. 3B, the equivalent inductor Le which is the inductance component of the bridge pattern 123 is provided between the ground terminal G and the ground electrode GND1.

In the DC-DC converter 20 configured in this manner, energy stored in the inductor L1 while the FET 211 is on is added to an input voltage as an inducted voltage when the FET 212 is on and the FET 212 is off, and smoothing is performed by the capacitor Cout. Thereby, the DC-DC converter 20 outputs a voltage that is higher than the input voltage.

Further, in the case of the present preferred embodiment, switching noise generated by the switching control IC 21 is transmitted from the ground terminal G of the switching control IC 21 over the second pattern 122, the bridge pattern 123, and the first pattern 121. At this time, as described in the first preferred embodiment, since the inductor L1 is close to and faces the bridge pattern 123, the magnetic material of the inductor L1 functions as the bead of a bead inductor for the bridge pattern 123 such that the switching noise transmitted through the bridge pattern 123 is significantly reduced and prevented. As a result, leakage of noise to an input line through the ground electrode pattern 12 is significantly reduced and prevented.

Figure 4A:
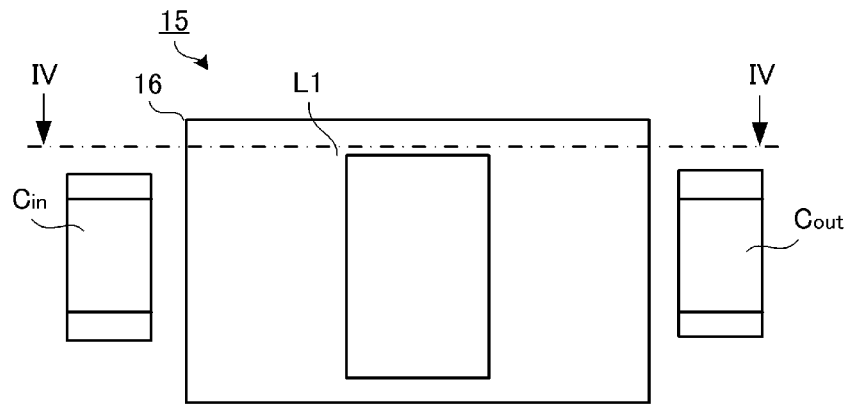
FIGS. 4A to 4C are schematic diagrams illustrating another exemplary configuration of a DC-DC converter.
Figure 4B:
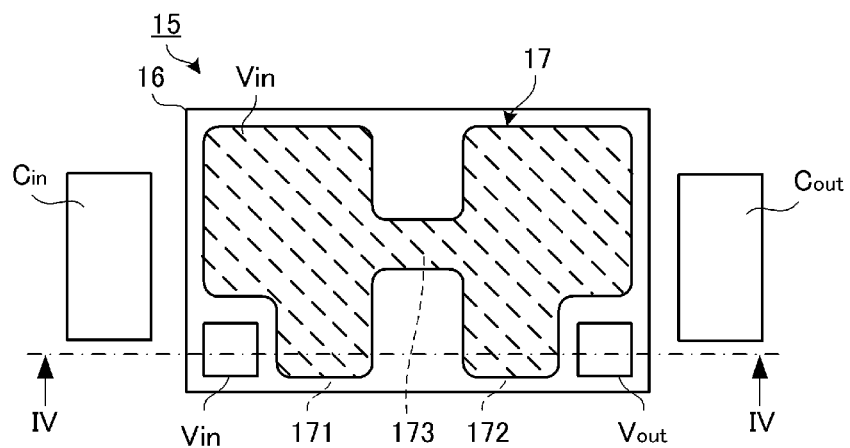
Figure 4C:
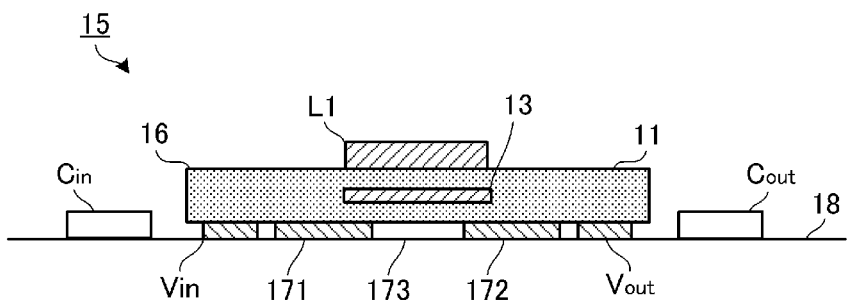

Note that although the DC-DC converters according to the first and second preferred embodiments preferably include configurations in which the capacitor Cin and the capacitor Cout are mounted on the top surface of the insulating substrate 11, the capacitor Cin and the capacitor Cout may be provided, for example, on a board on which the insulating substrate 11 is mounted, other than the insulating substrate 11, as illustrated in FIGS. 4A to 4C. FIGS. 4A to 4C are schematic diagrams illustrating another exemplary configuration of a DC-DC converter. FIG. 4A is a top view of a DC-DC converter 15. FIG. 4B is a bottom view of the DC-DC converter 15. FIG. 4C is a front sectional view taken along line IV-IV in FIG. 4A and 4B.

The inductor L1 is mounted on the top surface of an insulating substrate 16 provided in the DC-DC converter 15, and the switching control IC 13 is provided on an inner layer of the insulating substrate 16. The capacitor Cin and the capacitor Cout are mounted on a board 18 on which the DC-DC converter 15 is mounted.

The input terminal electrode Vin, the output terminal electrode Vout, and a ground electrode pattern 17 is provided on the bottom surface of the insulating substrate 16. The input terminal electrode Vin and the output terminal electrode Vout are located at positions similar to those in the first preferred embodiment. The capacitor Cin is connected to the input terminal electrode Vin and the capacitor Cout is connected to the output terminal electrode Vout.

The ground electrode pattern 17 is arranged over almost all the area of the bottom surface of the insulating substrate 16, except for the input terminal In and the output terminal electrode Vout. The ground electrode pattern 17 includes a first pattern 171, a second pattern 172, and a bridge pattern 173, and is arranged such that the bridge pattern 173 faces the inductor L1.

The bridge pattern 173 is arranged to have a shorter length in the lateral direction of the insulating substrate 16 than the first pattern 171 and the second pattern 172. Compared with the first preferred embodiment, the first pattern 171 and the second pattern 172 preferably have larger areas. Hence, the modification illustrated in FIG. 4 not only significantly reduces and prevents switching noise using the bridge pattern 173, but also can significantly reduce and prevent a noise component more effectively than the first preferred embodiment since the ground electrode pattern has a larger area and, hence, a larger shielding effect than in the first preferred embodiment.

Note that although step-up and step-down DC-DC converters have been described in the first and second preferred embodiments, a step-up/down converter may also be realized.

Third Preferred Embodiment

Hereinafter, a third preferred embodiment according to the present preferred embodiment will be described. A DC-DC converter according to the present preferred embodiment is a multiple-output DC-DC converter, and hereinafter, an example of a two-output DC-DC converter will be described.

Figure 5A:
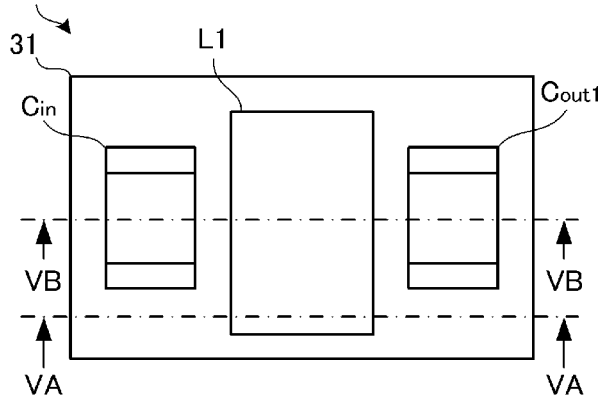
FIGS. 5A to 5C are schematic diagrams illustrating a configuration of a DC-DC converter according to a third preferred embodiment of the present invention.
Figure 5B:
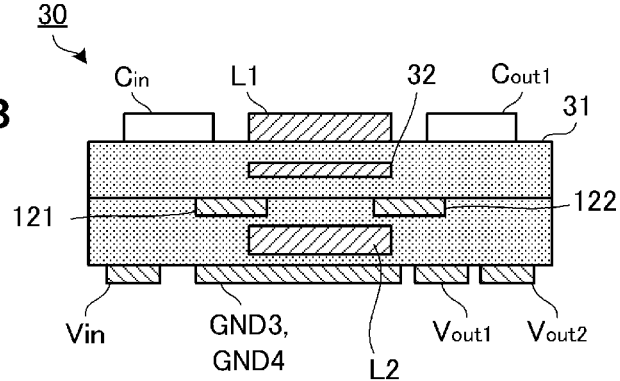
Figure 5C:
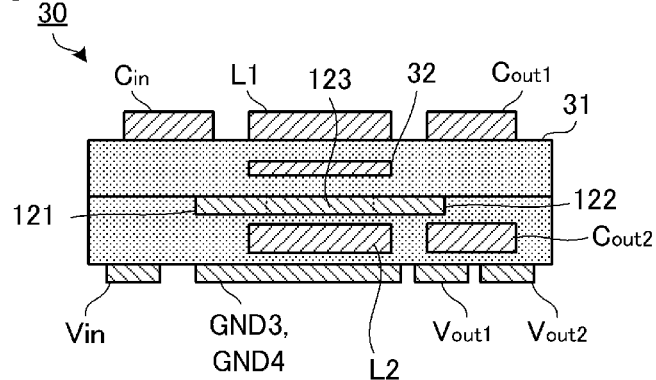

FIGS. 5A to 5C are schematic diagrams illustrating a configuration of a DC-DC converter 30 according to a third preferred embodiment. FIG. 5A is a top view of the DC-DC converter 30 according to the third preferred embodiment, FIG. 5B is a front sectional view taken along line VA-VA in FIG. 5A, and FIG. 5C is a front sectional view taken along line VB-VB in FIG. 5A.

The DC-DC converter 30 includes an insulating substrate 31. Similarly to the first preferred embodiment, the inductor L1, the capacitor Cin, and a capacitor Cout1 are mounted on the top surface of the insulating substrate 31.

A switching control IC 32 is provided on an inner layer of the insulating substrate 31. The switching control IC 32 switches a current flowing through the inductor L1 on and off.

The ground pattern including the first pattern 121, the second pattern 122, and the bridge pattern 123 described in FIG. 1B is provided on an inner layer of the insulating substrate 31 between the switching control IC 32 and the bottom surface of the insulating substrate 31. Further, an inductor L2 is provided on an inner layer (third layer) of the insulating substrate 31, at a position on the bottom surface side of the insulating substrate 31 so as to face the ground electrode pattern 12. The inductor L2, similarly to the inductor L1, is a chip inductor that is preferably formed by stacking and sintering magnetic green sheets (magnetic materials) including coil patterns printed thereon. The capacitor Cout is provided on the same layer (or a layer close to this layer) as the inductor L2.

The input terminal electrode Vin, output terminal electrodes Vout1 and Vout2, and ground terminal electrodes GND3 and GND4 are provided on the bottom surface of the insulating substrate 31. The ground terminal electrode GND3 is electrically connected to the first pattern 121 through a through hole (not shown). Similarly, the ground terminal electrode GND4 is electrically connected to the second pattern 122.

Figure 6:
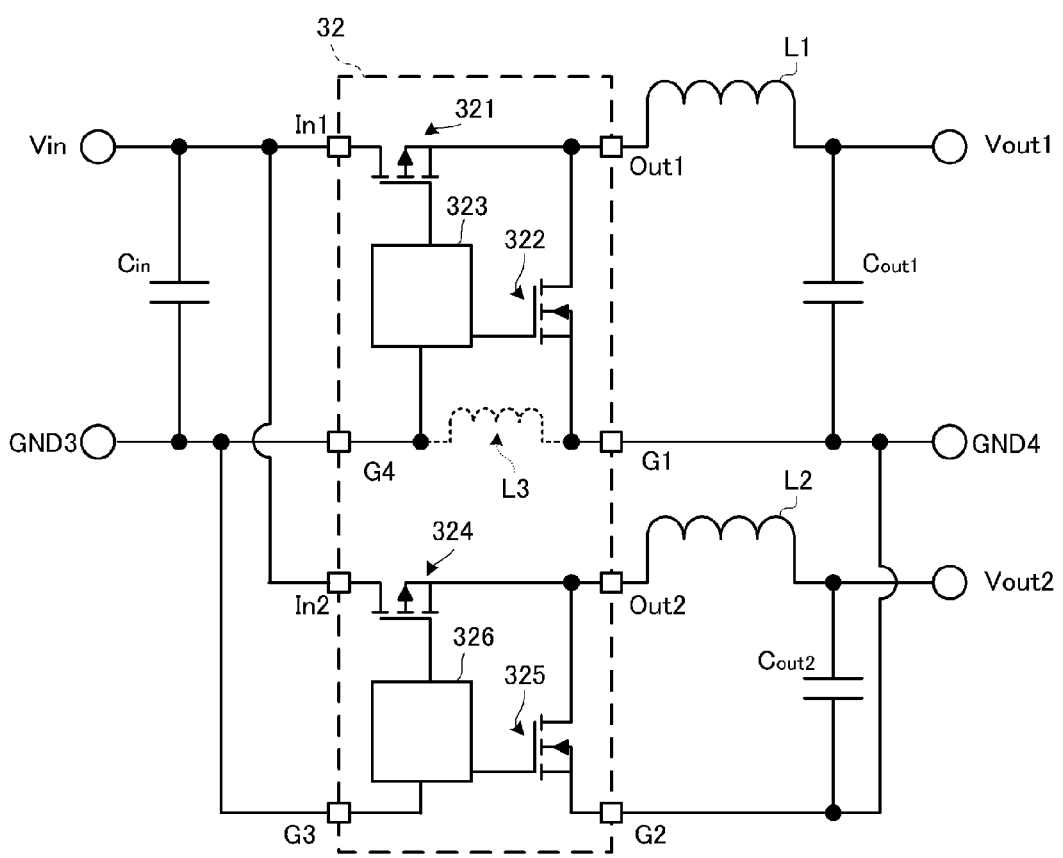
FIG. 6 is an equivalent circuit diagram of a DC-DC converter.

The wiring of the components of the DC-DC converter 30 will now be described. FIG. 6 is an equivalent circuit diagram of the DC-DC converter 30.

The switching control IC 32 includes two input terminals In1 and In2, two output terminals Out1 and Out2, and ground terminals G1, G2, G3, and G4.

An input line connected to the input terminal electrode Vin is connected to the input terminals In1 and In2. One end of the capacitor Cin is connected to the first pattern 121 and the other end of the capacitor Cin is connected to the input terminal electrode Vin.

The output terminal Out1 of the switching control IC 32 is connected to the output terminal electrode Vout1 through the inductor L1. One end of the capacitor Cout1 is connected to the ground terminal electrode GND4 and the other end of the capacitor Cout1 is connected to the output terminal electrode Vout1. The output terminal Out2 is connected to the output terminal electrode Vout2 through the inductor L2. One end of a capacitor Cout2 is connected to the ground terminal electrode GND4 and the other end of the capacitor Cout2 is connected to the output terminal electrode Vout2.

The ground terminals G1 and G2 of the switching control IC 32 are connected to the ground terminal electrode GND4. More specifically, the ground terminals G1 and G2 are connected to the ground terminal electrode GND4 through the second pattern 122.

The ground terminals G3 and G4 are connected to the ground terminal electrode GND3. More specifically, the ground terminals G3 and G4 are connected to the ground terminal electrode GND3 through the first pattern 121.

The switching control IC 32 includes p-type FETs 321 and 324, n-type FETs 322 and 325, and drivers 323 and 326 that perform switching control. The drain, source, and gate of the FET 321 are respectively connected to the input terminal In1, the output terminal Out1, and the driver 323. The drain, source, and gate of the FET 322 are respectively connected to the output terminal Out1, the ground terminal G1, and the driver 323. The ground side of the driver 323 is connected to the ground terminal G4.

The drain, source, and gate of the FET 324 are respectively connected to the input terminal In2, the output terminal Out2, and the driver 326. The drain, source, and gate of the FET 325 are respectively connected to the output terminal Out2, the ground terminal G2, and the driver 326. The ground side of the driver 326 is connected to the ground terminal G3.

The ground terminal G1 is connected to the second pattern 122, and the ground terminal G4 is connected to the first pattern 121. Hence, similarly to the first preferred embodiment, an equivalent inductor L3, which is the inductance component of the bridge pattern 123, is connected to the ground lines of the ground terminals G1 and G4.

The bridge pattern 123 of the DC-DC converter 30 is sandwiched between the inductor L1 and the inductor L2 in the up-down direction (thickness direction). Hence, the magnetic materials of the inductor L1 and the inductor L2 function as beads of the inductor L3 formed by the bridge pattern 123. In the first preferred embodiment, a magnetic material preferably is near only the top surface of the bridge pattern 123, whereas in the third preferred embodiment, magnetic materials preferably are near the top surface and the bottom surface of the bridge pattern 123. Hence, in the DC-DC converter 30 according to the third preferred embodiment, when switching noise generated by, for example, the drivers 323 and 326 is transmitted over the bridge pattern 123, the two magnetic materials of the inductors L1 and L2 absorb the magnetic flux excited by the switching noise current. As a result, a higher switching noise reduction and prevention effect is obtained compared with the first preferred embodiment.

Note that although a step-down multiple-output DC-DC converter has been described in the present preferred embodiment, a step-up or step-up/down multiple-output DC-DC converter may be realized. A multiple-output DC-DC converter that includes a step-down DC-DC converter and a step-up DC-DC converter may also be realized. The DC-DC converter 30 may be a multiple-output DC-DC converter with three or more outputs. Further, although the ground electrode patterns 12 and 17 preferably are substantially H-shaped, it is only preferable that the widths of the bridge patterns 123 and 173 are smaller than those of other electrode patterns. For example, the bridge patterns 123 and 173 may have meandering shapes.

Figure 7A:
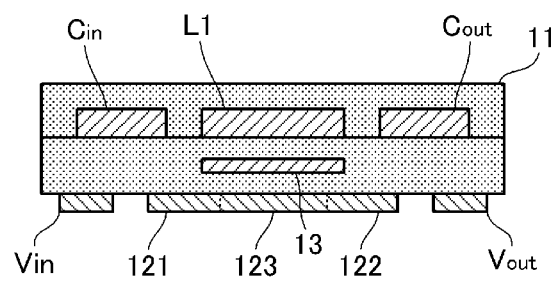
FIGS. 7A and 7B illustrate other exemplary configurations of the DC-DC converters according to the first and second preferred embodiments of the present invention.
Figure 7B:
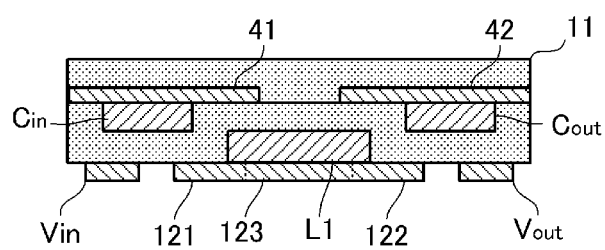

FIGS. 7A and 7B illustrate other exemplary configurations of the DC-DC converters according to the first and second preferred embodiments. Although magnetic components, such as the inductor L1, are preferably mounted on the top surface of the insulating substrate 11 in the first and second preferred embodiments, a configuration may be used in which these components are located on an inner layer of the insulating substrate 11, as illustrated in FIG. 7A. Further, in the case where the inductor L1 or the like is mounted on the top surface, the inductor L1 or the like may be molded using a resin, for example.

In the case where the inductor L1 or the like is mounted on an inner layer of the insulating substrate 11, the inductor L1 may be located on a layer that is different from the layer on which the capacitors Cin and Cout are provided, as illustrated in FIG. 7B. In the case of FIG. 7B, the inductor L1 is located on the lowermost layer of the insulating substrate 11. The capacitors Cin and Cout are mounted on an inner layer of the insulating substrate 11 on which ground electrode patterns 41 and 42 are provided. Note that in the case of FIG. 7B, the switching control IC 13 may be provided on any inner layer of the insulating substrate 11.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A DC-DC converter comprising:
an insulating layer including a plurality of insulator layers;
an input terminal and an output terminal provided on the insulating substrate;
a first inductor that includes a magnetic material and that is provided on a first layer of the insulating substrate and is connected between the input terminal and the output terminal;
a switching control unit that is provided in the insulating substrate and connected between the input terminal and the output terminal and that performs on/off control of a switching device; and
a ground electrode pattern provided on a second layer of the insulating substrate; wherein
the ground electrode pattern includes:
a first electrode pattern that is connected to the input terminal;
a second electrode pattern that is connected to the output terminal and is separated from the first electrode pattern; and
a connection electrode pattern that extends in a predetermined direction and connects the first and second electrode patterns to each other; and
the connection electrode pattern faces the first inductor and has a smaller width in a direction perpendicular or substantially perpendicular to the predetermined direction than that of the first and second electrode patterns.

2. The DC-DC converter according to claim 1, further comprising a capacitor that is provided on the first layer of the insulating substrate, wherein a first end of the capacitor is connected to the input terminal or the output terminal and a second end of the capacitor is connected to the first electrode pattern or the second electrode pattern.

3. The DC-DC converter according to claim 1, wherein the DC-DC converter is a multiple-output DC-DC converter, the output terminal is provided in a plurality, and the DC-DC converter further comprises:
a second inductor that is provided on a third layer of the insulating substrate which is on an opposite side of the first layer with respect to the second layer and that is connected to the input terminal or the output terminal; and
the second inductor includes a magnetic material and faces the first inductor with the connection electrode pattern disposed therebetween.

* * * * *